(12) United States Patent
Liu et al.

(10) Patent No.: US 11,910,704 B2
(45) Date of Patent: Feb. 20, 2024

(54) ORGANIC LIGHT EMITTING DIODE DEVICE AND DISPLAY PANEL

(71) Applicant: Wuhan China Star Optoelectronics Semiconductor Display Technology Co., Ltd., Hubei (CN)

(72) Inventors: Shengfang Liu, Hubei (CN); Weiwei Li, Hubei (CN); Mugyeom Kim, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 558 days.

(21) Appl. No.: 17/261,597

(22) PCT Filed: Aug. 26, 2020

(86) PCT No.: PCT/CN2020/111262
§ 371 (c)(1),
(2) Date: Jan. 20, 2021

(87) PCT Pub. No.: WO2022/007142
PCT Pub. Date: Jan. 13, 2022

(65) Prior Publication Data
US 2022/0190253 A1  Jun. 16, 2022

(30) Foreign Application Priority Data
Jul. 6, 2020  (CN) .................. 202010640976.0

(51) Int. Cl.
*H01L 29/08*  (2006.01)
*H10K 85/60*  (2023.01)
(Continued)

(52) U.S. Cl.
CPC .......... *H10K 85/626* (2023.02); *H10K 50/11* (2023.02); *H10K 50/12* (2023.02); *H10K 50/13* (2023.02);
(Continued)

(58) Field of Classification Search
CPC ...... H10K 85/626; H10K 50/12; H10K 50/13; H10K 2101/10; H10K 71/00; H10K 50/11; H10K 59/35; H10K 59/12; H10K 2102/351; H10K 59/351; H10K 50/125; H10K 50/856; H10K 50/81; H10K 59/121;
(Continued)

(56) References Cited

U.S. PATENT DOCUMENTS

| 9,024,303 B2 | 5/2015 | Park et al. |
| 2005/0093435 A1 | 5/2005 | Suh et al. |

(Continued)

FOREIGN PATENT DOCUMENTS

| CN | 101005119 | 7/2007 |
| CN | 101771071 | 7/2010 |

(Continued)

*Primary Examiner* — Niki H Nguyen

(57) ABSTRACT

An organic light emitting diode device and a display panel are provided. The display panel includes the organic light emitting diode device. The organic light emitting diode device includes an emitting material layer. The emitting material layer includes a first common blue-light light-emitting layer, a red-green-blue light emitting layer, and a second common blue-light light-emitting layer.

9 Claims, 2 Drawing Sheets

(51) Int. Cl.
*H10K 50/11* (2023.01)
*H10K 50/12* (2023.01)
*H10K 50/13* (2023.01)
*H10K 71/00* (2023.01)
*H10K 101/10* (2023.01)

(52) U.S. Cl.
CPC ......... *H10K 71/00* (2023.02); *H10K 2101/10* (2023.02)

(58) Field of Classification Search
CPC .. H10K 59/40; H10K 59/124; H10K 59/1213; H10K 85/6572; H10K 50/14; H10K 50/155; H10K 2101/27; H10K 2102/311; H10K 85/342; H10K 2102/331; H10K 50/8426; H10K 50/854; H10K 50/165; H10K 50/166; H10K 59/173; H10K 71/135; H10K 2101/90; H10K 2102/103; H10K 85/6574; H10K 71/13; H10K 50/814; H10K 71/60; H10K 85/636; H10K 2102/00; H10K 2101/20; H10K 59/60; H10K 50/816; H10K 59/50; H10K 59/129; H10K 2102/101; H10K 71/50; H10K 59/88; H10K 85/346; H10K 2102/3035; H10K 50/87; H10K 85/656; H10K 50/85; H10K 85/658
See application file for complete search history.

(56) References Cited

U.S. PATENT DOCUMENTS

| | | |
|---|---|---|
| 2007/0164278 A1 | 7/2007 | Lee et al. |
| 2010/0163854 A1 | 7/2010 | Kho et al. |
| 2017/0054101 A1 | 2/2017 | Pyo et al. |
| 2018/0358414 A1 | 12/2018 | Song et al. |
| 2018/0358585 A1 | 12/2018 | Yoneda et al. |
| 2018/0375058 A1 | 12/2018 | Kawamura et al. |
| 2020/0152902 A1 | 5/2020 | Lim et al. |
| 2021/0043866 A1 | 2/2021 | Kawamura et al. |
| 2022/0190254 A1* | 6/2022 | Li .................. H10K 85/626 |

FOREIGN PATENT DOCUMENTS

| | | |
|---|---|---|
| CN | 104576953 | 4/2015 |
| CN | 104766875 | 7/2015 |
| CN | 106601919 | 4/2017 |
| CN | 106920883 | 7/2017 |
| CN | 108269937 | 7/2018 |
| CN | 108281557 | 7/2018 |
| CN | 108369992 | 8/2018 |
| CN | 108807457 | 11/2018 |
| CN | 109616581 | 4/2019 |
| CN | 208955023 | 6/2019 |
| CN | 110265558 | 9/2019 |
| CN | 110335884 | 10/2019 |
| CN | 110660831 | 1/2020 |
| CN | 111092163 | 5/2020 |
| CN | 111180598 | 5/2020 |

* cited by examiner

ORGANIC LIGHT EMITTING DIODE DEVICE AND DISPLAY PANEL

RELATED APPLICATIONS

This application is a National Phase of PCT Patent Application No. PCT/CN2020/111262 having International filing date of Aug. 26, 2020, which claims the benefit of priority of Chinese Patent Application No. 202010640976.0 filed on Jul. 6, 2020. The contents of the above applications are all incorporated by reference as if fully set forth herein in their entirety.

FIELD AND BACKGROUND OF THE INVENTION

The present disclosure relates to the field of organic light emitting diodes, and particularly relates to an organic light emitting diode device and a display panel.

Currently, technology of active matrix organic light emitting diode (AMOLED) display devices are widely used in mobile phones, and are continuously heading towards directions of low power consumption, low cost, and large dimensions. Compared to liquid crystal displays (LCDs), because organic light emitting diode (OLED) devices can be used in flexible screens, and a problem of short service life on light emitting is improved greatly with development of material technology, mainframe factories and vendors have researched and developed OLED technology one after another. From traditional instrument and center consoles to head up displays (HUDs), streaming rearview mirrors, and illuminations, they are all involved.

Currently, Samsung Electronics Co., Ltd. and LG Corporation of Korea are in leading positions. BOE Technology Group Co., Ltd. and Tianma microelectonics Co., Ltd of China follow closely. Side-by-side (SBS) in-vehicle organic light emitting diode devices mainly focused by Samsung company currently are similar to mobile phone structures. The structures cannot achieve electric current efficiency and service life level of cascaded tandem structures. In-vehicle organic light emitting diode devices with cascaded tandem structures are mainly focused by LG company. Compared to the SBS device structures, their electric current efficiency can be improved 1.5 to 2 times, and service life can be improved 2 to 4 times. However doubling evaporation chambers is needed for tandem workgroup structures, which increases complication on mass production processes and is unfavorable to manufacturing.

As illustrated in FIG. 1 and FIG. 2, an organic light emitting diode device usually includes an anode, a cathode, and a light emitting unit between the anode and the cathode. According to different numbers of light emitting units, organic light emitting diode devices can be divided into side-by-side organic light emitting diode devices and cascaded tandem organic light emitting diode devices.

Illustrated in FIG. 1 is an organic light emitting diode device 910. There is only one light emitting unit 93 located between an anode 91 and a cathode 92. The light emitting unit 93 includes a hole transport layer (HTL) 931, an emitting material layer (EML) 932, and an electron transport layer (ETL) 933. Wherein, the emitting material layer (EML) includes a red light emitting layer R, a green light emitting layer G, and a blue light emitting layer B.

Illustrated in FIG. 2 is a cascaded tandem organic light emitting diode device 920. A plurality of light emitting units 93 are disposed between an anode 91 and a cathode 92. Adjacent light emitting units 93 are connected through a charge generation layer (CGL) 94. Each of the light emitting units 93 includes a hole transport layer (HTL) 931, an emitting material layer (EML) 932, and an electron transport layer (ETL) 933. Wherein, the emitting material layer (EML) includes a red light emitting layer R, a green light emitting layer G, and a blue light emitting layer B. The cascaded tandem organic light emitting diode device 920 has higher electric current light emitting efficiency, and its light emitting efficiency is increased with a number of the tandem light emitting units 93, and it can be doubled. In a same brightness, compared to the side-by-side organic light emitting diode device 910, service life of the organic light emitting diode device 920 with the tandem structure is increased exponentially.

However, in the in-vehicle OLED devices, electric current efficiency and service life of blue light are always shortcoming for hindering application. Furthermore, manufacturing processes of the cascaded tandem organic light emitting diode devices are complicated. Many accurate mask plates are required to be used, resulting in increasement of manufacturing cost, reduction of aperture ratio, and reduction of yield during manufacturing multiplied chambers.

SUMMARY OF THE INVENTION

The present disclosure provides an organic light emitting diode device and a display panel. On one hand, electric current efficiency and service life of the side-by-side organic light emitting diode devices can be improved, solving insufficiency of service life and efficiency of blue light; on the other hand, processes of using a plurality of accurate mask plates to manufacture the multiplied chambers for cascaded tandem organic light emitting diode devices are omitted, thereby reducing manufacturing cost, improving aperture ratio, and facilitating improvement of entire yield.

One embodiment of the present disclosure provides an organic light emitting diode device, including an emitting material layer. The emitting material layer includes a first common blue-light light-emitting layer, a red-green-blue light emitting layer, and a second common blue-light light-emitting layer. The red-green-blue light emitting layer is disposed on the first common blue-light light-emitting layer. The red-green-blue light emitting layer includes a red light emitting layer R, a green light emitting layer G, and a blue light emitting layer B disposed side by side on a same layer. The second common blue-light light-emitting layer is disposed on the red-green-blue light emitting layer.

Furthermore, a thickness of the red light emitting layer R, a thickness of the green light emitting layer G, and a thickness of the blue light emitting layer B are same.

Furthermore, the red light emitting layer R, the green light emitting layer G, and the blue light emitting layer B are quantum dot light emitting layers.

Furthermore, the organic light emitting diode device further includes an anode layer, a hole injection layer, a hole transport layer, an electron transport layer, and a cathode layer. The hole injection layer is disposed on the anode layer. The hole transport layer is disposed on the hole injection layer. The emitting material layer is disposed on the hole transport layer. The electron transport layer is disposed on the emitting material layer. The cathode layer is disposed on the electron transport layer.

Furthermore, a host material of the second common blue-light light-emitting layer is a preferred electron type material, and its chemical formula is:

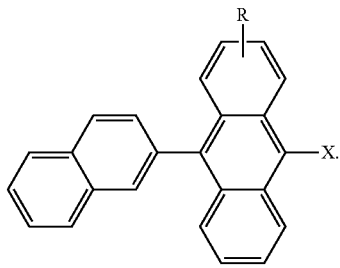

Wherein, R is hydrogen or is a substituent with one to twenty carbon atoms selected from the group consisting of a phenyl group derivative, a naphthalene group derivative, and an aryl group derivative, X is one selected from the group consisting of a naphthalene group derivative, a phenyl group derivative, and a phenylnaphthalene derivative, or a phenylanthracene derivative monomer, and the host material of the second common blue-light light-emitting layer includes at least one compound selected from the group consisting of anthracene dinaphthalene, anthracene dibiphenyl, anthracene naphthalene biphenyl, and anthracene diphenyl.

Furthermore, a host material of the second common blue-light light-emitting layer is a preferred electron type material, and its chemical formula is:

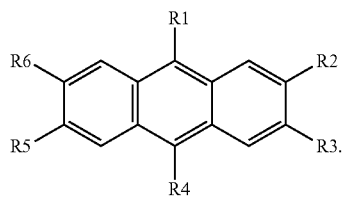

Wherein, each of R1, R2, R3, R4, R5 and R6 represents a hydrogen atom, a halogen atom, a hydroxyl group, a cyano group, a nitro group, or a group including a carbonyl group with twenty or less carbon atoms, a group including a carbonyl ester group, an alkyl group, an alkenyl group, an alkoxyl group, a group including a silyl group with thirty or less carbon atoms, a group including an aryl group, a group comprising a heterocyclic group, a group including an amino group, or a derivative thereof.

Furthermore, a host material of the second common blue-light light-emitting layer is a preferred electron type material, and its chemical formula is one selected from the group consisting of:

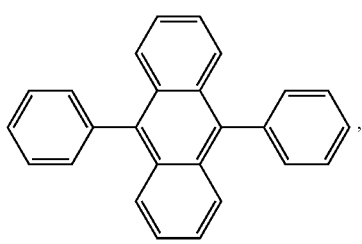

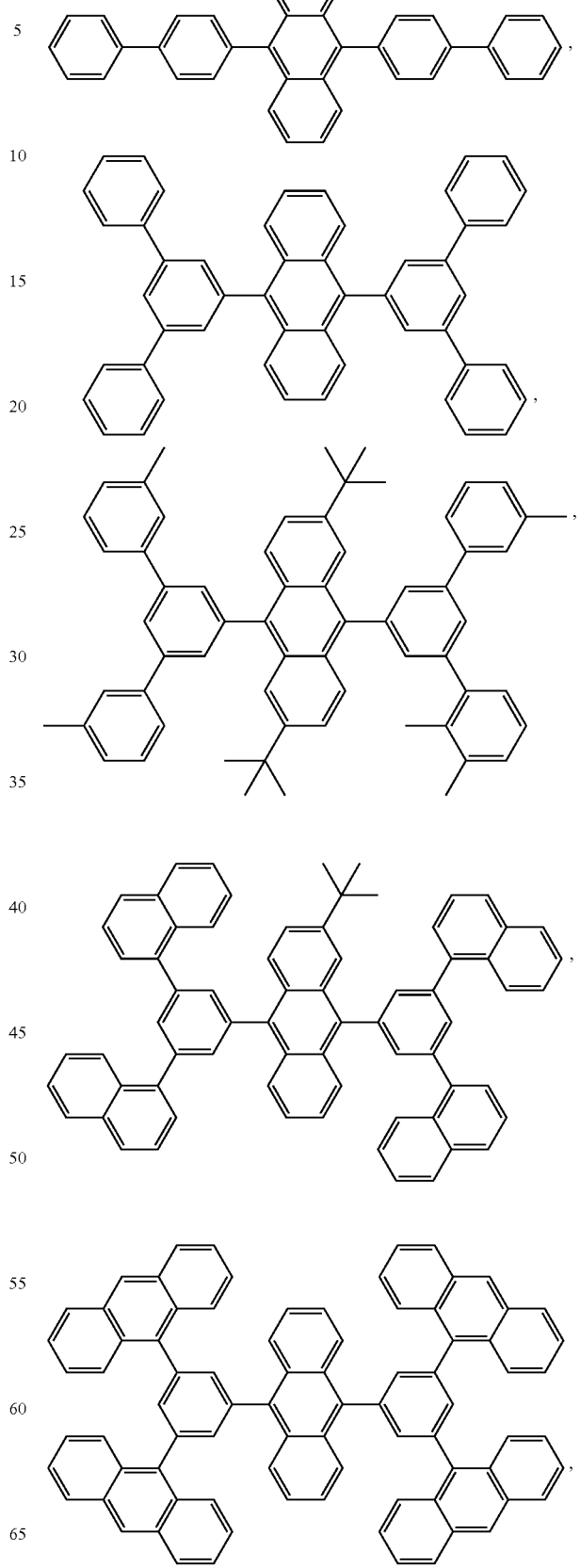

-continued

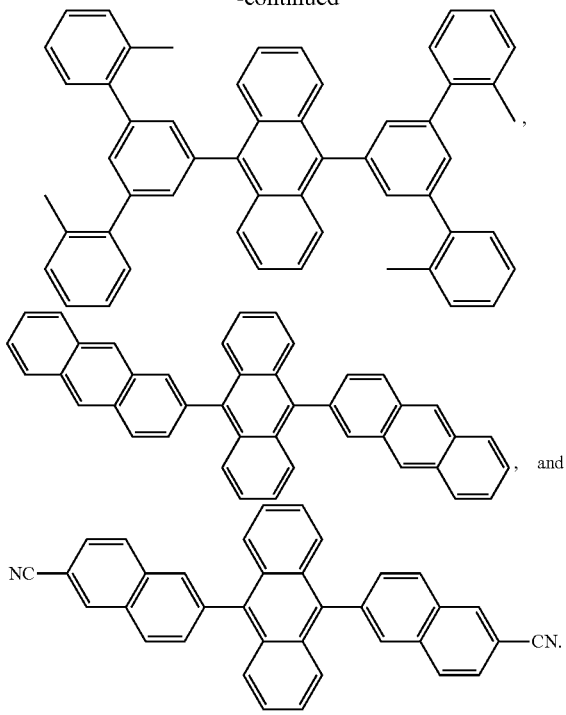

Furthermore, a host material of the first common blue-light light-emitting layer is a preferred hole type material, including N,N'-Di-[(1-naphthalenyl)-N,N'-diphenyl]-1,1'-biphenyl)-4,4'-diamine (NPB), or 4,4',4"-tris(carbazol-9-yl)-triphenylamine (TCTA).

Furthermore, the first common blue-light light-emitting layer includes a blue light fluorescent dopant, and the blue light fluorescent dopant includes one selected from the group consisting of 4,4'-bis(2,2-diphenylvinyl)-1,1'-biphenyl (DPVBi), spiro-4,4'-bis(2,2'-diphenylvinyl)-1,1'-biphenyl (spiro-DPVBi), and spiro-6P.

The present disclosure further provides a display panel, including any organic light emitting diode device mentioned above.

Beneficial effect of the present disclosure is to provide the organic light emitting diode device and the display panel. On one hand, electric current efficiency and service life of the side-by-side organic light emitting diode device can be improved to solve insufficiency of the service life and the efficiency of the blue light by connecting the first common blue-light light-emitting layer and the second common blue-light light-emitting layer to the blue light emitting layer of the red-green-blue light emitting layer; on the other hand, by reducing numbers of structures and film layers, that is, reducing the number of multiplied chambers, processes of using a plurality of accurate mask plates to manufacture the multiplied chambers for cascaded tandem organic light emitting diode devices can be omitted compared to cascaded tandem organic light emitting diode devices, thereby reducing manufacturing cost, improving aperture ratio, and facilitating improvement of entire yield.

DESCRIPTION OF SPECIFIC EMBODIMENTS OF THE INVENTION

The technical solutions in the embodiments of the present disclosure are clearly and completely described in the following with reference to the accompanying drawings in the embodiments of the present disclosure. Obviously, the described embodiments are only part of the embodiments of the present disclosure, but are not all embodiments of the present disclosure. All other embodiments obtained by those skilled in the art based on the embodiments of the present disclosure without creative efforts are within the scope of the present disclosure.

In the description of the present disclosure, unless specified or limited otherwise, terms "mounted," "connected," "coupled," and the like are used in a broad sense, and may include, for example, fixed connections, detachable connections, or integral connections; may also be mechanical or electrical connections or may be communication between each other; may also be direct connections or indirect connections via intervening structures; may also be inner communications of two elements or may be a relationship of interaction between two elements. For persons skilled in the art in this field, the specific meanings of the above terms in the present disclosure can be understood with specific cases.

In the present disclosure, unless expressly specified or limited otherwise, a first feature is "on" or "beneath" a second feature may include that the first feature directly contacts the second feature and may also include that the first feature does not directly contact the second feature. Furthermore, a first feature "on," "above," or "on top of" a second feature may include an embodiment in which the first feature is right "on," "above," or "on top of" the second feature and may also include that the first feature is not right "on," "above," or "on top of" the second feature, or just means that the first feature has a sea level elevation higher than the sea level elevation of the second feature. While first feature "beneath," "below," or "on bottom of" a second feature may include that the first feature is "beneath," "below," or "on bottom of" the second feature and may also include that the first feature is not right "beneath," "below," or "on bottom of" the second feature, or just means that the first feature has a sea level elevation lower than the sea level elevation of the second feature.

Figure 1:
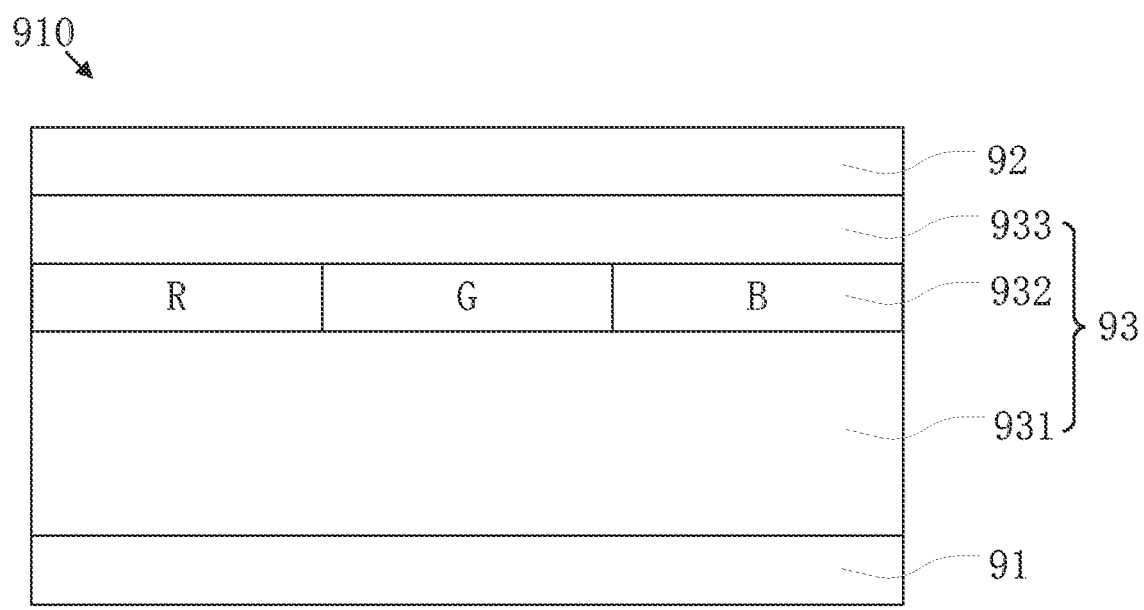
FIG. 1 is a structural schematic diagram of a side-by-side organic light emitting diode device.
Figure 2:
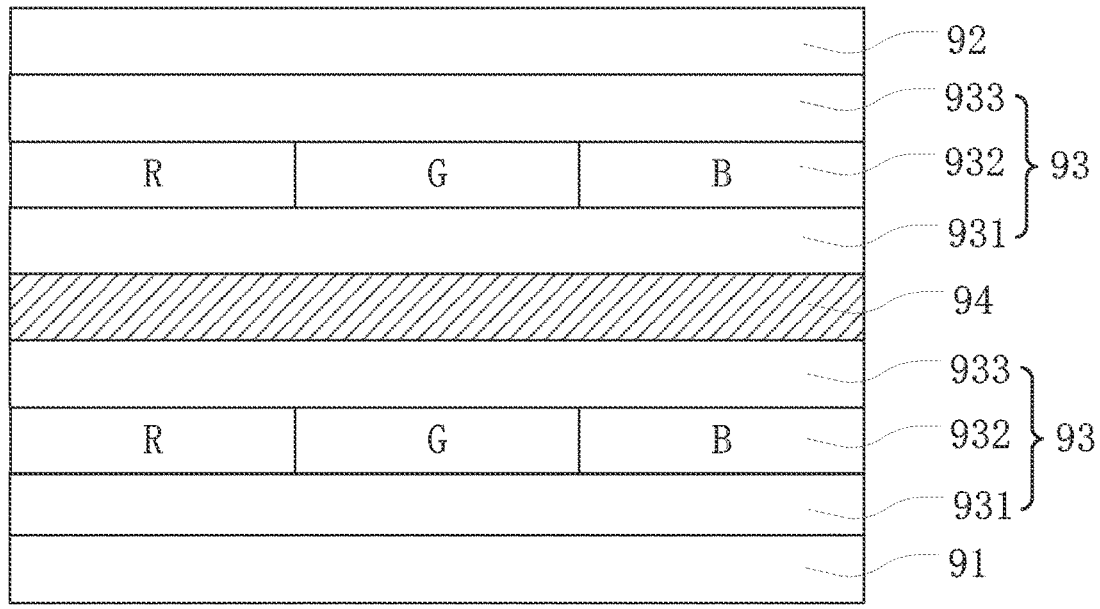
FIG. 2 is a structural schematic diagram of a cascaded tandem organic light emitting diode device.
Figure 3:
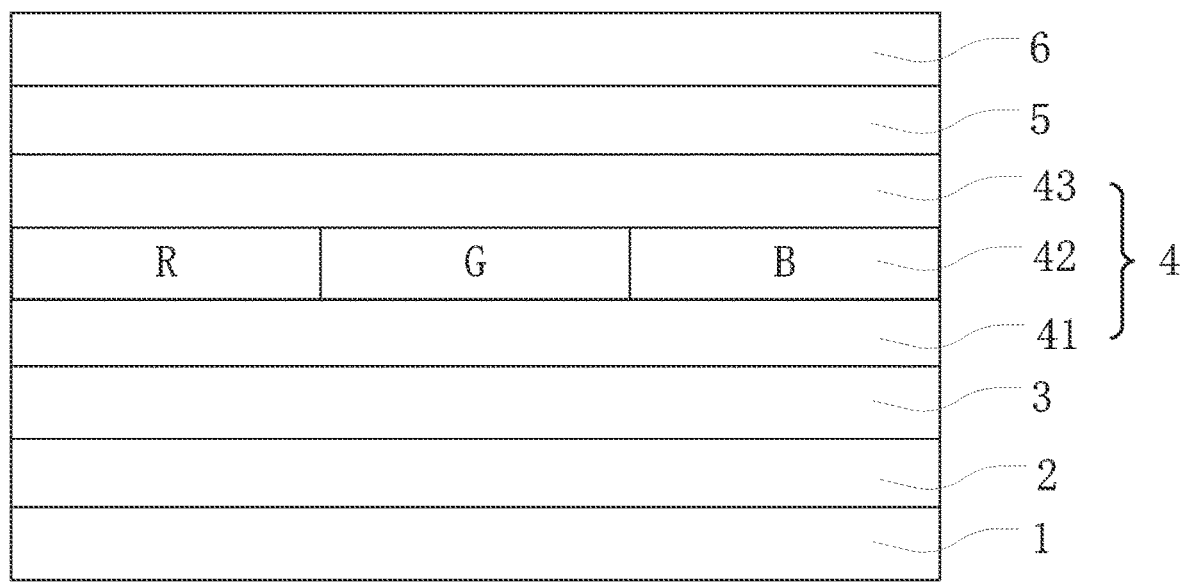
FIG. 3 is a structural schematic diagram of an organic light emitting diode in one embodiment of the present disclosure.

Specifically, please refer to FIG. 3, one embodiment of the present disclosure provides an organic light emitting diode device, including an emitting material layer 4. The emitting material layer 4 includes a first common blue-light light-emitting layer 41, a red-green-blue light emitting layer 42, and a second common blue-light light-emitting layer 43. The red-green-blue light emitting layer 42 is disposed on the first common blue-light light-emitting layer 41. The red-green-blue light emitting layer 42 includes a red light emitting layer R, a green light emitting layer G, and a blue light emitting layer B disposed side by side on a same layer. The second common blue-light light-emitting layer 43 is disposed on the red-green-blue light emitting layer 42.

In the present disclosure, on one hand, electric current efficiency and service life of the side-by-side organic light emitting diode device can be improved to solve shortcoming of the service life and the efficiency of the blue light by connecting the first common blue-light light-emitting layer 41 and the second common blue-light light-emitting layer 43 to the blue light emitting layer B of the red-green-blue light emitting layer 42; on the other hand, by reducing numbers of structures and film layers, that is, reducing the number of multiplied chambers, processes of using a plurality of accurate mask plates to manufacture the multiplied chambers for cascaded tandem organic light emitting diode devices can be omitted compared to cascaded tandem organic light emitting diode devices, thereby reducing manufacturing cost, improving aperture ratio, and facilitating improvement of entire yield.

In this embodiment, a thickness of the red light emitting layer R, a thickness of the green light emitting layer G, and a thickness of the blue light emitting layer B are same, making a thickness of the red-green-blue light emitting layer 42 homogeneous.

In this embodiment, the red light emitting layer R, the green light emitting layer G, and the blue light emitting layer B are quantum dot light emitting layers, having better light emitting effect.

In this embodiment, the organic light emitting diode device 100 further includes an anode layer 1, a hole injection layer 2, a hole transport layer 3, an electron transport layer 5, and a cathode layer 6. The hole injection layer 2 is disposed on the anode 1. The hole transport layer 3 is disposed on the hole injection layer 2. The emitting material layer 4 is disposed on the hole transport layer 3. The electron transport layer 5 is disposed on the emitting material layer 4. The cathode layer 6 is disposed on the electron transport layer 5.

In this embodiment, a host material of the second common blue-light light-emitting layer 43 is a preferred electron type material, and its chemical formula is:

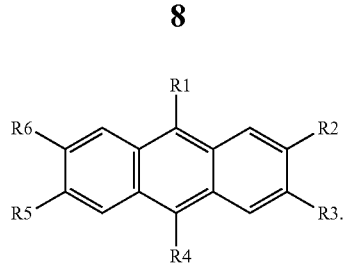

Wherein, each of R1, R2, R3, R4, R5, and R6 represents a hydrogen atom, a halogen atom, a hydroxyl group, a cyano group, a nitro group, or a group comprising a carbonyl group with twenty or less carbon atoms, a group including a carbonyl ester group, an alkyl group, an alkenyl group, an alkoxyl group, a group including a silyl group with thirty or less carbon atoms, a group including an aryl group, a group including a heterocyclic group, a group comprising an amino group, or a derivative thereof.

In this embodiment, a host material of the second common blue-light light-emitting layer 43 is a preferred electron type material, and its chemical formula is one selected from the group consisting of:

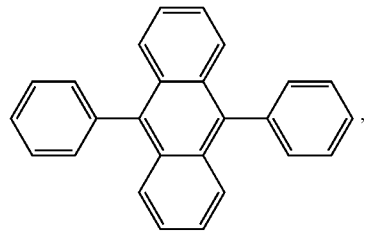

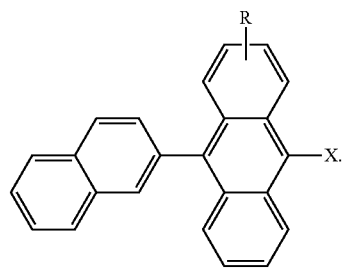

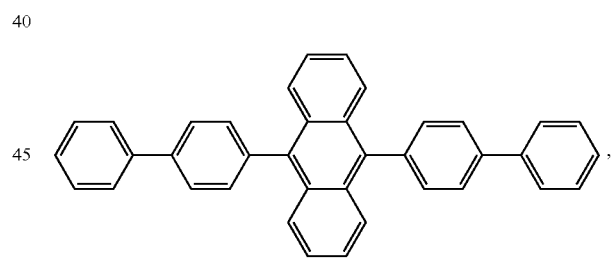

Wherein, R is hydrogen or is a substituent with one to twenty carbon atoms selected from the group consisting of a phenyl group derivative, a naphthalene group derivative, and an aryl group derivative, X is one selected from the group consisting of a naphthalene group derivative, a phenyl group derivative, or a phenylnaphthalene derivative, and a phenylanthracene derivative monomer, and the host material of the second common blue-light light-emitting layer 60 includes at least one compound selected from the group consisting of anthracene dinaphthalene, anthracene dibiphenyl, anthracene naphthalene biphenyl, and anthracene diphenyl.

In this embodiment, a host material of the second common blue-light light-emitting layer 43 is a preferred electron type material, and its chemical formula is:

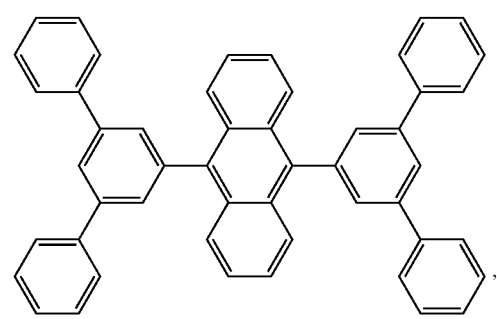

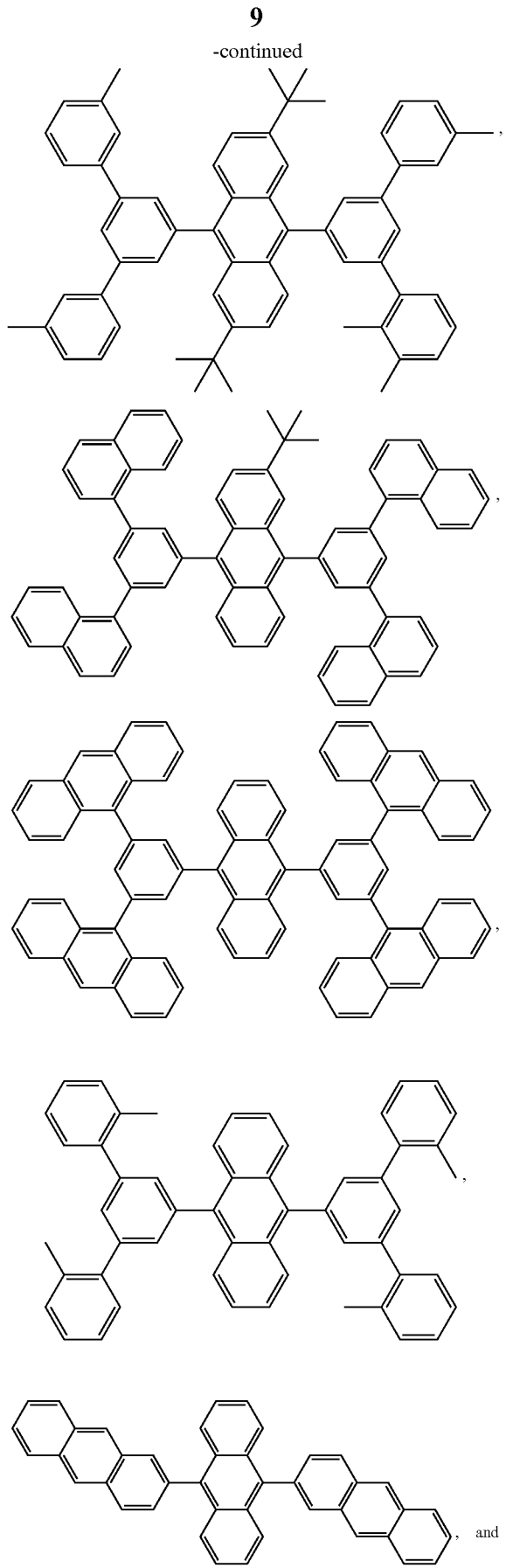

In this embodiment, a host material of the first common blue-light light-emitting layer 41 is a preferred hole type material, including N,N'-Di-[(1-naphthalenyl)-N,N'-diphenyl]-1,1'-biphenyl)-4,4'-diamine (NPB), or 4,4',4"-tris(carbazol-9-yl)-triphenylamine (TCTA).

In this embodiment, the first common blue-light light-emitting layer 41 includes a blue light fluorescent dopant, and the blue light fluorescent dopant includes one selected from the group consisting of 4,4'-Bis(2,2-diphenylvinyl)-1,1'-biphenyl (DPVBi), spiro-4,4'-bis(2,2'-diphenylvinyl)-1,1'-biphenyl (spiro-DPVBi), and spiro-6P.

A host material of a second injection transport layer of this embodiment is a preferred electron material, and an energy level of a highest occupied molecular orbital (HOMO) of the host material of the second injection transport layer is less than energy levels of highest occupied molecular orbitals (HOMOs) of the red light emitting layer R and the green light emitting layer G, exerting effect of blocking electron holes for the red light emitting layer R and the green light emitting layer G. In other embodiment, the host material of the second injection transport layer is a preferred hole material, and energy levels of highest occupied molecular orbitals (HOMOs) of the red light emitting layer R and the green light emitting layer G are less than an energy level of a highest occupied molecular orbital (HOMO) of the host material of the second injection transport layer.

The present disclosure further provides a display panel, including any organic light emitting diode device 100 mentioned above.

Beneficial effect of the present disclosure is to provide the organic light emitting diode device 100 and the display panel. On one hand, electric current efficiency and service life of the side-by-side organic light emitting diode device can be improved to solve insufficiency of the service life and the efficiency of the blue light by connecting the first common blue-light light-emitting layer 41 and the second common blue-light light-emitting layer 43 to the blue light emitting layer B of the red-green-blue light emitting layer 42, on the other hand, by reducing the numbers of structures and film layers, that is, reducing the number of multiplied chambers, processes of using a plurality of accurate mask plates to manufacture the multiplied chambers for cascaded tandem organic light emitting diode devices can be omitted compared to cascaded tandem organic light emitting diode devices, thereby reducing manufacturing cost, improving aperture ratio, and facilitating improvement of entire yield.

In the embodiments mentioned above, the descriptions to the various embodiments are emphasized, and the part is not described in detailed in an embodiment, can refer to the detailed description of other embodiments mentioned above.

The organic light emitting diode device and the display panel provided by embodiments of the present disclosure are described in detail above. The description of the embodiments mentioned above is only for helping to understand the technical solution and the core idea of the present disclosure. It should be understood by those skilled in the art, that it can perform changes in the technical solution of the embodiments mentioned above, or can perform equivalent replacements in part of technical characteristics, and the changes or replacements do not make the essence of the corresponding technical solution depart from the scope of the technical solution of each embodiment of the present disclosure.

What is claimed is:

1. An organic light emitting diode device, comprising an emitting material layer, wherein the emitting material layer comprises:
   a first common blue-light light-emitting layer;
   a red-green-blue light emitting layer disposed on the first common blue-light light-emitting layer, wherein the red-green-blue light emitting layer comprises a red light emitting layer, a green light emitting layer, and a blue light emitting layer disposed side by side on a same layer; and
   a second common blue-light light-emitting layer disposed on the red-green-blue light emitting layer;
   wherein the red light emitting layer, the green light emitting layer, and the blue light emitting layer are quantum dot light emitting layers.

2. The organic light emitting diode device as claimed in claim 1, wherein a thickness of the red light emitting layer, a thickness of the green light emitting layer, and a thickness of the blue light emitting layer are same.

3. The organic light emitting diode device as claimed in claim 1, wherein the organic light emitting diode device comprises:
   an anode layer;
   a hole injection layer disposed on the anode layer;
   a hole transport layer disposed on the hole injection layer;
   the emitting material layer disposed on the hole transport layer;
   an electron transport layer disposed on the emitting material layer; and
   a cathode layer disposed on the electron transport layer.

4. The organic light emitting diode device as claimed in claim 1, wherein a host material of the second common blue-light light-emitting layer is a preferred electron type material, and its chemical formula is:

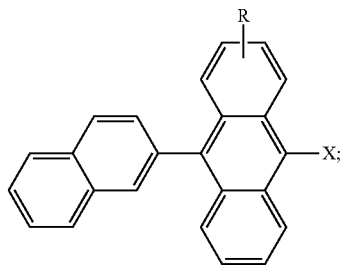

wherein R is hydrogen or is a substituent with one to twenty carbon atoms selected from the group consisting of a phenyl group derivative, a naphthalene group derivative, and an aryl group derivative, X is one selected from the group consisting of a naphthalene group derivative, a phenyl group derivative, a phenylnaphthalene derivative, and a phenylanthracene derivative monomer, and the host material of the second common blue-light light-emitting layer comprises at least one compound selected from the group consisting of anthracene dinaphthalene, anthracene dibiphenyl, anthracene naphthalene biphenyl, and anthracene diphenyl.

5. The organic light emitting diode device as claimed in claim 1, wherein a host material of the second common blue-light light-emitting layer is a preferred electron type material, and its chemical formula is:

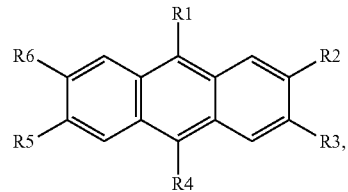

wherein each of R1, R2, R3, R4, R5 and R6 represents a hydrogen atom, a halogen atom, a hydroxyl group, a cyano group, a nitro group, or a group comprising a carbonyl group with twenty or less carbon atoms, a group comprising a carbonyl ester group, an alkyl group, an alkenyl group, an alkoxyl group, a group comprising a silyl group with thirty or less carbon atoms, a group comprising an aryl group, a group comprising a heterocyclic group, a group comprising an amino group, or a derivative thereof.

6. An organic light emitting diode device, comprising an emitting material layer, wherein the emitting material layer comprises:
   a first common blue-light light-emitting layer;
   a red-green-blue light emitting layer disposed on the first common blue-light light-emitting layer, wherein the red-green-blue light emitting layer comprises a red light emitting layer, a green light emitting layer, and a blue light emitting layer disposed side by side on a same layer; and
   a second common blue-light light-emitting layer disposed on the red-green-blue light emitting layer;
   wherein a host material of the second common blue-light light-emitting layer is a preferred electron type material, and its chemical formula is one selected from the group consisting of:

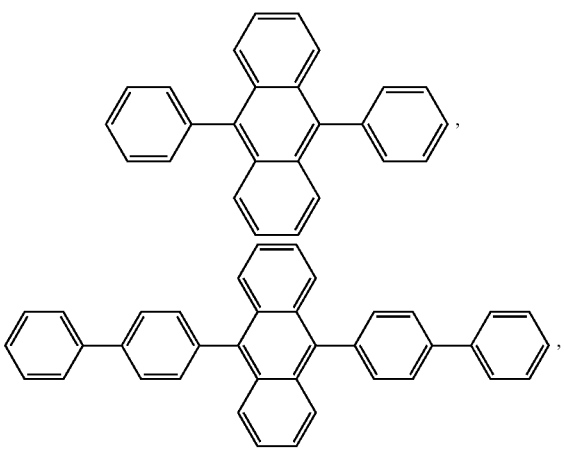

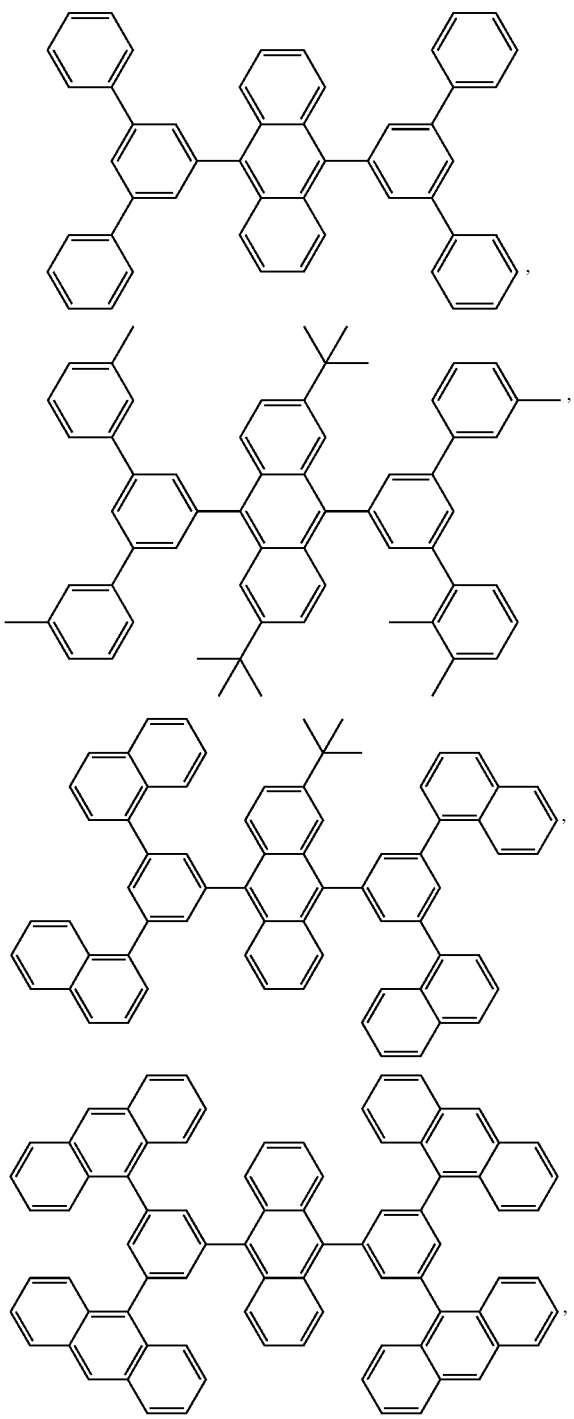

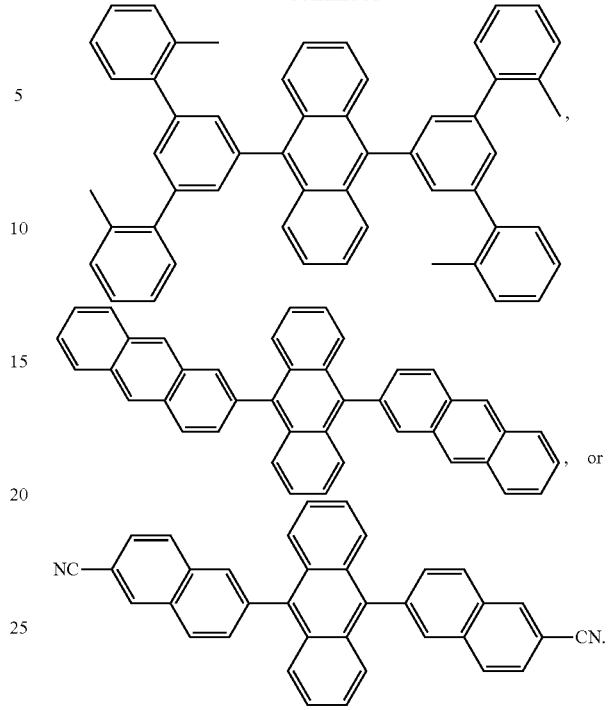

7. The organic light emitting diode device as claimed in claim 1, wherein a host material of the first common blue-light light-emitting layer is a preferred hole type material, comprising N,N'-Di-[1-naphthalenyl]-N,N'-diphenyl]1,1'-biphenyl)-4,4'-diamine, or 4,4',4''-tris(carbazol-9-yl)-triphenylamine.

8. The organic light emitting diode device as claimed in claim 1, wherein the first common blue-light light-emitting layer comprises a blue light fluorescent dopant, and the blue light fluorescent dopant comprises one selected from the group consisting of 4,4'-bis(2,2-diphenylvinyl)-1,1'-biphenyl, spiro-4,4'-bis(2,2'-diphenylvinyl)-1,1'-biphenyl, and spiro-6P.

9. A display panel, comprising an organic light emitting diode device, comprising an emitting material layer, wherein the emitting material layer comprises:
 a first common blue-light light-emitting layer;
 a red-green-blue light emitting layer disposed on the first common blue-light light-emitting layer, wherein the red-green-blue light emitting layer comprises a red light emitting layer, a green light emitting layer, and a blue light emitting layer disposed side by side on a same layer; and
 a second common blue-light light-emitting layer disposed on the red-green-blue light emitting layer;
 wherein the red light emitting layer, the green light emitting layer, and the blue light emitting layer are quantum dot light emitting layers.

\* \* \* \* \*